United States Patent
Brandenburg et al.

(10) Patent No.: US 7,739,791 B2
(45) Date of Patent: Jun. 22, 2010

(54) METHOD OF PRODUCING AN OVERMOLDED ELECTRONIC MODULE WITH A FLEXIBLE CIRCUIT PIGTAIL

(75) Inventors: Scott D. Brandenburg, Kokomo, IN (US); David A Laudick, Kokomo, IN (US); Gary E. Oberlin, Windfall, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/978,063

(22) Filed: Oct. 26, 2007

(65) Prior Publication Data

US 2009/0106974 A1      Apr. 30, 2009

(51) Int. Cl.
*H05K 13/00* (2006.01)

(52) U.S. Cl. ............... 29/856; 29/827; 29/841; 174/529; 174/536; 174/551; 174/564; 257/666; 257/787; 257/E23.092

(58) Field of Classification Search ............ 29/856, 29/827, 840, 841, 832; 174/529, 536, 551, 174/564; 257/666, 667, 787, E23.092, E23.125
See application file for complete search history.

(56) References Cited

U.S. PATENT DOCUMENTS

| | | | |
|---|---|---|---|
| 4,235,832 A | | 11/1980 | Leighton |
| 4,701,999 A | * | 10/1987 | Palmer .................... 29/827 |
| 5,455,384 A | | 10/1995 | Ichihara |
| 5,939,775 A | * | 8/1999 | Bucci et al. ............... 257/667 |
| 6,107,690 A | * | 8/2000 | Courtenay et al. ......... 257/787 |
| 6,180,045 B1 | | 1/2001 | Brandenburg et al. |
| 6,285,551 B1 | | 9/2001 | Brandenburg et al. |
| 6,307,749 B1 | | 10/2001 | Daanen et al. |
| 6,471,276 B1 | | 10/2002 | Brunsman et al. |
| 6,779,260 B1 | * | 8/2004 | Brandenburg et al. ......... 29/841 |
| 6,807,731 B2 | | 10/2004 | Brandenburg et al. |
| 6,940,159 B2 | | 9/2005 | Morinaga et al. |
| 7,230,829 B2 | | 8/2006 | Mandel et al. |
| 7,361,844 B2 | * | 4/2008 | Vinciarelli et al. .......... 174/260 |
| 2005/0081377 A1 | | 4/2005 | Brandenburg et al. |

FOREIGN PATENT DOCUMENTS

| | | |
|---|---|---|
| EP | 0347974 | 12/1989 |
| EP | 1328141 | 7/2003 |

(Continued)

OTHER PUBLICATIONS

European Search Report dated Jun. 8, 2009.

*Primary Examiner*—Thiem Phan
(74) *Attorney, Agent, or Firm*—Jimmy L. Funke

(57) ABSTRACT

A method of producing an overmolded electronic assembly including a circuit board and a flexible circuit interconnect by fixturing the assembly in a mold cavity such that a portion of the flexible circuit protrudes from the mold, and providing a compressible elastomeric interface between the mold and the flexible circuit to seal off the mold cavity and protect the flexible circuit from damage due to the clamping force of the mold. The portion of the flexible circuit within the mold cavity is pre-coated with a material that ensures good adhesion with the molding compound, and a heat exchanger thermally coupled to the portion of the flexible circuit that protrudes from the mold protects the flexible circuit from damage due to thermal conduction from the mold and mold compound.

1 Claim, 1 Drawing Sheet

FOREIGN PATENT DOCUMENTS

| | | |
|---|---|---|
| EP | 1600274 | 11/2005 |
| EP | 1672972 | 6/2006 |
| GB | 1256224 | 12/1971 |
| WO | 01/84618 | 11/2001 |
| WO | 2004/058477 | 7/2004 |

\* cited by examiner

METHOD OF PRODUCING AN OVERMOLDED ELECTRONIC MODULE WITH A FLEXIBLE CIRCUIT PIGTAIL

TECHNICAL FIELD

The present invention relates to an overmolded electronic module in which a circuit board populated with electronic components is overmolded with plastic resin, and more particularly to a method of producing an overmolded electronic module with a flexible circuit pigtail for electrically accessing the circuit board components.

BACKGROUND OF THE INVENTION

Electronic assemblies designed for harsh environments can be overmolded with a plastic encapsulant to form an environmentally sealed module, as shown for example in the U.S. Pat. Nos. 6,180,045, 6,307,749 and 6,779,260, assigned to the assignee of the present invention. Typically, a connector header is incorporated or molded into the module so that a wiring harness may be attached directly to the module. However, it would be more useful in some applications to equip the module with a flexible circuit pigtail in lieu of a connector header. Accordingly, what is needed is a method of producing an overmolded electronic module with a flexible circuit pigtail.

SUMMARY OF THE INVENTION

The present invention is directed to a method of overmolding an electronic assembly including a circuit board and a flexible circuit interconnect. The assembly is fixtured in a mold cavity such that a portion of the flexible circuit protrudes from the mold, and a compressible elastomeric interface between the mold and the flexible circuit seals off the mold cavity and protects the flexible circuit from damage due to the clamping force of the mold. The portion of the flexible circuit within the mold cavity is pre-coated with a material that ensures good adhesion with the molding compound, and a heat exchanger thermally coupled to the portion of the flexible circuit that protrudes from the mold protects the flexible circuit from damage due to thermal conduction from the mold and mold compound.

DESCRIPTION OF THE PREFERRED EMBODIMENT

Figure 1:
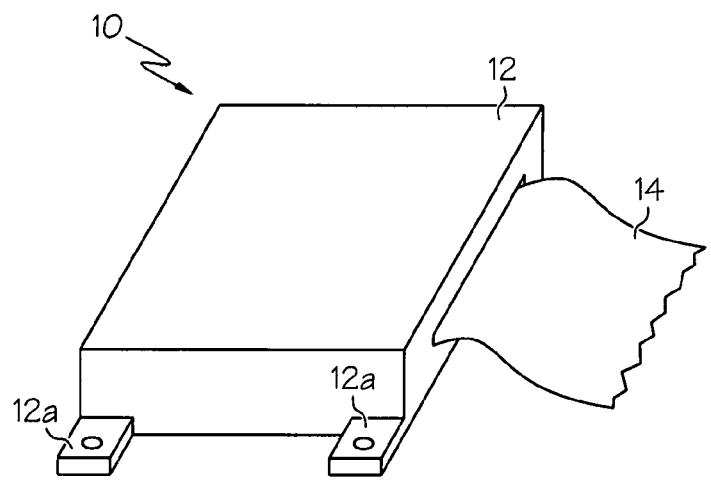
FIG. 1 is an isometric view of an overmolded electronic module having a flexible circuit pigtail according to this invention.

Referring to FIG. 1, the reference numeral 10 generally designates an overmolded electronic module produced according to this invention. An electronic assembly is encapsulated within a plastic resin housing 12 to environmentally seal the assembly. The mounting tabs 12a may be part of the housing 12, or may be an exposed portion of a metal frame that provides a ground reference to the electronic assembly. Unlike most overmolded modules, the module 10 is provided with a pigtail in the form of a flexible circuit 14, and the plastic resin housing 12 forms a seal around the flexible circuit 14.

Figure 2:
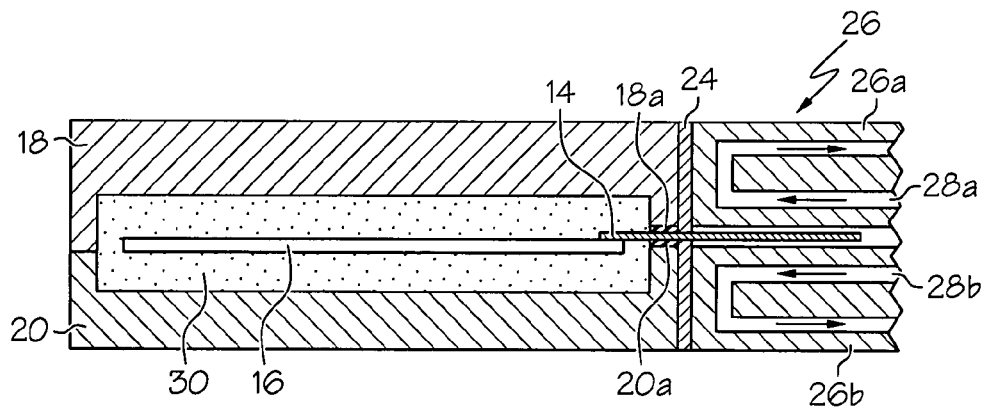
FIG. 2 is cross-sectional view of a molding apparatus for producing the overmolded electronic module of FIG. 1 according to a first embodiment of this invention.
Figure 3:
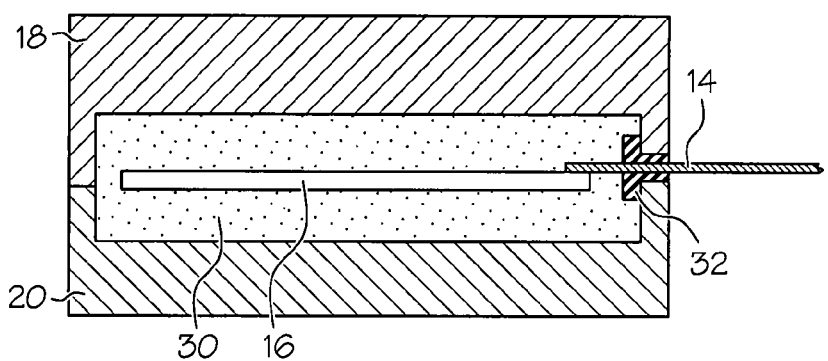
FIG. 3 is cross-sectional view of a molding apparatus for producing the overmolded electronic module of FIG. 1 according to a second embodiment of this invention.

FIGS. 2 and 3 depict two related but different methods of forming the overmolded module 10. In each case, the electronic assembly to be encapsulated includes a circuit board 16 populated with electronic components (not shown) and the flexible circuit 14. The flexible circuit 14 may be a flat ribbon cable or a flexible printed circuit, and is attached and electrically coupled to circuit board 16 using a conventional technique, such as crimping, soldering (through-hole surface mount or hot bar) or gluing. Alternately, the flexible circuit 14 may be provided with compliant pin terminations that press into circuit board through-holes, or the circuit board 16 may be provided with a flexible cable connector. Taken alone, certain of these attachment techniques might lack the durability needed for a given application, but encapsulating the circuit board 16 and flexible circuit connections mechanically locks the various parts together to provide the desired durability and reliability.

In general, the electronic assembly comprising circuit board 16 and flexible circuit 14 is encapsulated by fixturing it a mold cavity defined by upper and lower mold halves 18 and 20 such that a portion of the flexible circuit 14 protrudes from the mold. The mold halves 18, 20 are heated to a temperature such as 165° C., and the unoccupied volume of the mold cavity is filled with a thermoset or thermoplastic resin molding compound 30 that at least partially cures in the mold over a prescribed interval such as 30-90 seconds. The mold halves 18, 20 are then separated, and the encapsulated module 10 is removed to finish curing in a heated curing chamber (not shown).

The issues addressed by the present invention concern providing adequate sealing around the flexible circuit 14 and protecting the flexible circuit 14 from mechanical and thermal damage during the overmolding process.

One issue is ensuring good adhesion between the molding compound 30 and the exterior periphery of flexible circuit 14. The adhesion can vary depending on the flexible circuit material, and in cases where the adhesion may be inadequate, a pre-mold surface treatment is applied to the portion of the flexible circuit 14 that will be encapsulated. Suitable surface treatment materials include silane and polyimide, which can be dispensed in liquid form as a spray. The pre-mold coating adheres well to the flexible circuit 14, and the molding compound 30 adheres well to the pre-mold coating.

Another issue concerns how the upper and lower mold halves 18 and 20 close on the flexible circuit 14 during the overmolding process. In general, this issue is addressed by providing a compressible elastomeric interface between the flexible circuit 14 and the mold halves 18 and 20. In the embodiment of FIG. 2, the elastomeric interface is provided by a pair of elastomeric pads 18a and 20a built into the upper and lower mold halves 18 and 20, respectively. When the mold halves 18, 20 are joined, the elastomeric pads 18a and 20a compress against upper and lower surfaces of the flexible circuit 14. This not only seals the mold cavity so that the molding compound 30 will not leak past flexible circuit 14, but also protects the flexible circuit 14 from damage due to the clamping force applied to the mold halves 18, 20. FIG. 3 depicts an alternate approach in which an elastomeric sleeve 32 is placed over the flexible circuit 14 prior to overmolding so that the mold halves 18, 20 clamp down on the elastomeric sleeve 32 when the mold is closed. In effect, the elastomeric sleeve 32 is insert molded with the circuit board 16 and flexible circuit 14, and becomes part of the encapsulated module 10.

A final issue concerns protecting the flexible circuit 14 from thermal damage during the overmolding process. One way this issue is addressed is through judicious selection of the insulating material of flexible circuit 14. For example, nylon or phenolic insulation is thermally limited to temperatures of 85° C. or less, whereas polyimide insulation can withstand operating temperatures of up to 180° C. In cases where the mold temperature is near the thermal limit of the flexible circuit insulation, a heat exchanger 26 may be used to protect the flexible circuit 14 from thermal damage as illustrated in FIG. 2. Referring to FIG. 2, a thermal barrier 24 is disposed between the mold halves 18, 20 and the heat exchanger 26, and the portion of flexible circuit 14 that protrudes from the mold halves 18, 20 is inserted through a slot opening formed in the thermal barrier 24. The heat exchanger 26 comprises an upper portion 26a and a lower portion 26b that close around at least a portion the flexible circuit 14, and liquid coolant flowing through passages 28a, 28b formed in the upper and lower portions 26a, 26b remove heat from the flexible circuit 14, and relieve thermal stress on its insulation. Alternately, of course, the heat exchanger 26 may be configured as a single part with a slot opening into which the flexible circuit 14 is inserted.

In summary, the present invention provides a practical method of producing an overmolded module with flexible circuit pigtail. While the method has been described with respect to the illustrated embodiment, it is recognized that numerous modifications and variations in addition to those mentioned herein will occur to those skilled in the art. For example, while the method has been illustrated in respect to a thin flat flexible circuit, it can also be applied to other flexible circuits such as ribbon cables, or even an insulated wiring harness. Accordingly, it is intended that the invention not be limited to the disclosed embodiment, but that it have the full scope permitted by the language of the following claims.

The invention claimed is:

1. A method of producing an overmolded electronic assembly, comprising the steps of:
   connecting one end of a flexible circuit interconnect to an electronic assembly;
   fixturing the electronic assembly and flexible circuit interconnect in a mold cavity defined by upper and lower mold halves such that a portion of said flexible circuit interconnect extends out of said mold cavity and passes between said upper and lower mold halves;
   providing an upper compressible elastomeric pad on said upper mold half and a lower compressible elastomeric pad on said lower mold half, and clamping the mold halves together such that said flexible circuit interconnect is sandwiched between said upper and lower compressible elastomeric pads to isolate said flexible circuit interconnect from said mold halves and to seal said mold cavity around said flexible circuit interconnect prior to injection of encapsulant material into said mold cavity;
   positioning a heat exchanger adjacent said mold halves for receiving an end portion of said flexible circuit interconnect to remove heat from said flexible circuit interconnect;
   positioning a thermal barrier between said heat exchanger and said mold halves;
   injecting encapsulant material into said mold cavity to overmold said electronic assembly and a portion of said flexible circuit interconnect;
   removing said overmolded electronic assembly from said mold cavity upon curing of said encapsulant material; and
   removing said heat exchanger and said thermal barrier when said overmolded electronic assembly is removed from said mold cavity.

* * * * *